US008227182B2

(12) United States Patent
Lee et al.

(10) Patent No.: US 8,227,182 B2
(45) Date of Patent: Jul. 24, 2012

(54) METHODS OF FORMING A PHOTOSENSITIVE FILM

(75) Inventors: Ahn-Ho Lee, Gyeonggi-do (KR);
Baik-Soon Choi, Gyeonggi-do (KR);
Seung-Hyun Ahn, Gyeonggi-do (KR);
Sang-Tae Kim, Jeonbuk (KR); Yong-Il Kim, Seoul (KR); Shi-Jin Sung, Seoul (KR); Kyong-Ho Lee, Daejeon (KR)

(73) Assignees: Samsung Electronics Co., Ltd. (KR);
Dongwoo Fine-Chem Co., Ltd. (KR)

( * ) Notice: Subject to any disclaimer, the term of this patent is extended or adjusted under 35 U.S.C. 154(b) by 394 days.

(21) Appl. No.: 12/539,041

(22) Filed: Aug. 11, 2009

(65) Prior Publication Data

US 2010/0034962 A1     Feb. 11, 2010

(30) Foreign Application Priority Data

Aug. 11, 2008  (KR) ........................ 10-2008-0078421
Jan. 21, 2009   (KR) ........................ 10-2009-0004874

(51) Int. Cl.
*G03F 7/00*     (2006.01)
*G03F 7/26*     (2006.01)
*G03F 7/30*     (2006.01)
*G03F 7/40*     (2006.01)

(52) U.S. Cl. .................. 430/331; 430/270.1; 430/311; 430/329; 430/330

(58) Field of Classification Search ............... 430/270.1, 430/311, 331, 329, 330
See application file for complete search history.

(56) References Cited

U.S. PATENT DOCUMENTS

| 6,225,240 | B1 * | 5/2001 | You et al. ..................... 438/782 |
| 6,458,518 | B1 * | 10/2002 | Moon et al. .................. 430/329 |
| 6,497,784 | B1 * | 12/2002 | Jones et al. .............. 156/345.12 |
| 6,589,719 | B1 * | 7/2003 | Ahn et al. ..................... 430/331 |
| 6,682,876 | B2 * | 1/2004 | Ahn et al. ..................... 430/329 |
| 7,105,265 | B2 * | 9/2006 | Ohnishi et al. ............... 430/256 |
| 7,157,386 | B2 * | 1/2007 | Andres et al. ................ 438/782 |
| 7,183,181 | B2 * | 2/2007 | Li et al. ........................ 438/503 |
| 7,354,693 | B2 * | 4/2008 | Hatakeyama et al. ..... 430/270.1 |
| 7,612,028 | B2 * | 11/2009 | Lee et al. ...................... 510/175 |
| 7,691,559 | B2 * | 4/2010 | Chang et al. .............. 430/270.1 |
| 2007/0087951 | A1 * | 4/2007 | Lee et al. ...................... 510/176 |
| 2007/0212894 | A1 * | 9/2007 | Nakazawa .................... 438/758 |
| 2008/0102211 | A1 * | 5/2008 | Matsuo et al. ................ 427/340 |
| 2010/0055924 | A1 * | 3/2010 | Ganesan et al. ............. 438/748 |

FOREIGN PATENT DOCUMENTS

KR         1909464098      2/2005
KR         1020060104688 A   10/2006

* cited by examiner

*Primary Examiner* — Amanda C. Walke
(74) *Attorney, Agent, or Firm* — Myers Bigel Sibley & Sajovec, PA

(57) ABSTRACT

In a thinner composition and a method of forming a photosensitive film, the thinner composition includes about 50 to about 90% by weight of propylene glycol monomethyl ether acetate, about 1 to about 20% by weight of propylene glycol monomethyl ether, about 1 to about 10% by weight of γ-butyrolactone, and about 1 to about 20% by weight of n-butyl acetate. The thinner composition may have a proper volatility and an improved ability to dissolve various types of photosensitive materials, and thus the thinner composition may be usefully employed in an edge bead rinse process, a rework process or a pre-wetting process.

13 Claims, 5 Drawing Sheets

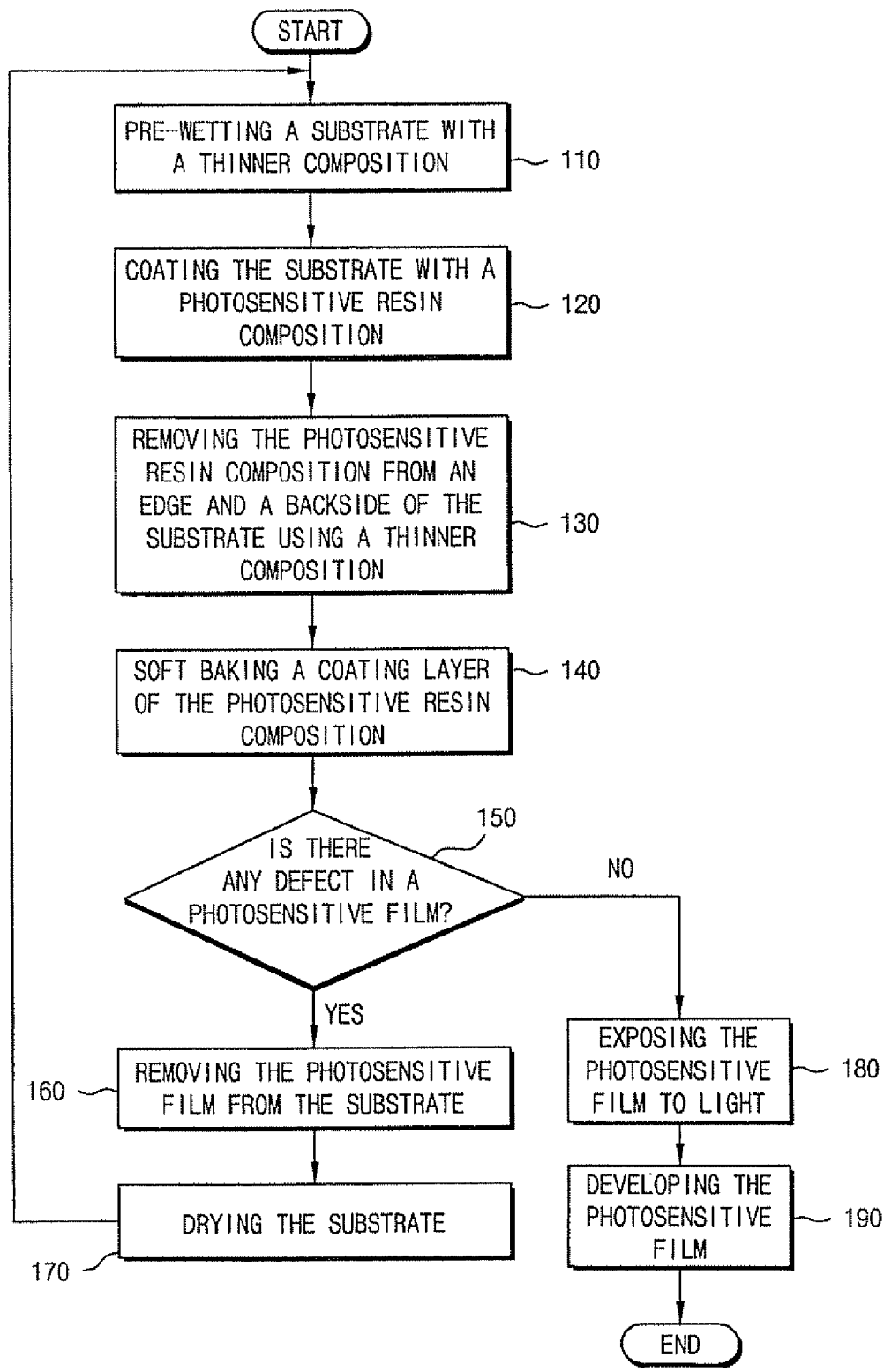

METHODS OF FORMING A PHOTOSENSITIVE FILM

CROSS-REFERENCE TO RELATED APPLICATIONS

This application claims priority under 35 U.S.C. §119 to Korean Patent Application No. 10-2008-0078421 filed on Aug. 11, 2008 and Korean Patent Application No. 10-2009-0004874 filed on Jan. 21, 2009 in the Korean Intellectual Property Office (KIPO), the contents of which are herein incorporated by reference in their entirety as if set forth fully herein.

FIELD OF INVENTION

The present invention relates to photosensitive films and, more particularly, to compositions and methods of forming photosensitive films.

BACKGROUND

A photolithography process may be a general process for forming a pattern. In the photolithography process, a predetermined pattern of a photomask may be transferred into a photoresist film on a wafer, and then an underlying layer may be etched according to a photoresist pattern. Such a photolithography process may have an affect on fineness and/or integration degree of a circuit in the fabrication of electronic devices such as a semiconductor memory device, an integrated circuit device, a TFT LCD, etc.

In a photolithography process, a photoresist film may be formed on a wafer by coating with a photoresist material. The photoresist film may be exposed to light by projecting a pattern of a photomask or a reticle with an exposure apparatus, and then the photoresist film may be developed to form a photoresist pattern having a desired image. The wafer or an underlying layer may be etched using the photoresist pattern as an etching mask. An ion implantation process may be performed on a wafer or a structure on a wafer using the photoresist pattern as a mask. The photoresist pattern may be removed from a substrate by ashing or stripping.

A variety of light sources may be used in the photolithography process. For example, the light source of the exposure process may be a C-line, an I-line, KrF, ArF, ultraviolet radiation, electron beam, X-ray, etc. The G-line has a relatively long wavelength, and the X-ray has a relative short wavelength.

The photoresist film may be formed using a photoresist material that is sensitive to light having a specific wavelength. The photoresist material may have components (e.g., resin, photosensitive agent, additives, etc.) that may be dependent on the type of light sources. When chemical structures of the resin or photosensitive agents vary, physical or chemical properties (e.g., sensitivity to light, etch-resistance, stripping property, solubility in solvent) of the photoresist material also may also vary largely.

In a photolithography process, a thinner composition is a material used for removing a photoresist or diluting a photoresist, due to its ability to dissolve photoresist. The dissolving ability of the thinner composition may depend on the chemical composition of the thinner and/or components of a photoresist to be dissolved. The commercial thinner composition may dissolve a specific type of photoresist, but may not have good ability to dissolve various types of photoresist, since various types of photoresist generally have substantially different chemical compositions.

As an integration degree and/or pattern density of a semiconductor device increases, usage of a wafer having a large diameter also increases. The large wafer may be rinsed while rotating at a relatively slow speed. The wafer may shake at the slow rotational speed. Thus, the thinner composition having a poor or improper dissolving rate for photoresist may not uniformly remove edge beads of photoresist.

SUMMARY

Some embodiments of the present invention include a thinner composition including about 50 to about 90% by weight of propylene glycol monomethyl ether acetate, about 1 to about 20% by weight of propylene glycol monomethyl ether, about 1 to about 10% by weight of γ-butyrolactone, and about 1 to about 20% by weight of n-butyl acetate.

In some embodiments, the thinner composition includes about 55 to about 80% by weight of propylene glycol monomethyl ether acetate, about 5 to about 20% by weight of propylene glycol monomethyl ether, about 3 to about 8% by weight of γ-butyrolactone, and about 5 to about 20% by weight of n-butyl acetate.

Some embodiments provide that the thinner composition includes about 60 to about 80% by weight of propylene glycol monomethyl ether acetate, about 5 to about 20% by weight of propylene glycol monomethyl ether, about 3 to about 8% by weight of γ-butyrolactone, and about 5 to about 15% by weight of n-butyl acetate.

In some embodiments, the thinner composition has a relative volatility in a range of about 0.2 to about 0.8, based on a volatility of n-butyl acetate.

Some embodiments of the thinner composition include a surfactant. In some embodiments, the surfactant includes a fluorine-based surfactant, a non-ionic surfactant or an ionic surfactant in an amount in a range of about 10 ppm to about 500 ppm, based on a total weight of the thinner composition.

Some embodiments of the present invention include methods of forming a photosensitive film. Such methods may include coating a substrate with a photosensitive composition to form a coating layer of the photosensitive composition on a substrate and removing a portion of the coating layer of the photosensitive composition from the substrate by applying a thinner composition to the substrate. The thinner composition may include about 50 to about 90% by weight of propylene glycol monomethyl ether acetate, about 1 to about 20% by weight of propylene glycol monomethyl ether, about 1 to about 10% by weight of γ-butyrolactone, and about 1 to about 20% by weight of n-butyl acetate.

In some embodiments, removing a portion of the coating layer of the photosensitive composition from the substrate includes applying the thinner composition to an edge portion of the substrate to selectively remove a portion of the coating layer of the photosensitive composition formed on the edge of the substrate. Some embodiments provide that applying the thinner composition to the edge portion of the substrate includes spraying the thinner composition to the edge portion of the substrate under a pressurized condition while rotating the substrate. In some embodiments, the substrate rotates at a speed of about 300 to about 3,000 rpm, and the thinner composition is sprayed at a flow rate of about 5 to about 50 mL/min.

Some embodiments provide that removing a portion of the coating layer of the photosensitive composition from the substrate includes applying the thinner composition to a backside of the substrate to selectively remove a portion of the coating layer attached to the backside of the substrate. Some embodiments include pre-wetting the substrate with the thinner composition prior to coating the substrate with the photosensitive composition. In some embodiments, the photosensitive composition is at least one selected from the group consisting of an I-line photoresist including a novolac-based resin, a KrF photoresist including poly(hydroxystyrene) partially protected by an acetal group or a tert-butyl carbonate group, an ArF photoresist including a (meth)acrylate-based resin, a KrF bottom anti-reflective coating including a triazine-based resin, and an ArF bottom anti-reflective coating including a polyester resin.

Some embodiments of the present invention include baking the coating layer of the photosensitive composition to form a photosensitive film on the substrate, after removing a portion of the coating layer of the photosensitive composition from the substrate by applying the thinner composition to the substrate. Some embodiments further include detecting a defect existing on the photosensitive film and removing the photosensitive film having the defect from the substrate by applying the thinner composition to the photosensitive film.

Some embodiments of the present invention include pre-wetting the substrate with the thinner composition prior to coating the substrate with the photosensitive composition and baking the coating layer of the photosensitive composition to form a photosensitive film on the substrate, after removing a portion of the coating layer of the photosensitive composition from the substrate by applying the thinner composition to the substrate. Yet further embodiments may include detecting a defect existing on the photosensitive film and removing the photosensitive film having the defect from the substrate by applying the thinner composition to the photosensitive film.

Some embodiments of the present invention include methods of forming a photosensitive film. Some methods may include coating a substrate with a thinner composition to raise wettability of the substrate, the thinner composition including about 50 to about 90% by weight of propylene glycol monomethyl ether acetate, about 1 to about 20% by weight of propylene glycol monomethyl ether, about 1 to about 10% by weight of γ-butyrolactone, and about 1 to about 20% by weight of n-butyl acetate. Embodiments may further include coating the substrate with a photosensitive composition.

In some embodiments, coating the substrate with the thinner composition is performed using the thinner composition having a relative volatility in a range of about 0.2 to about 0.8, based on a volatility of n-butyl acetate. Some embodiments provide that coating the substrate with the thinner composition is performed using the thinner composition including about 60 to about 80% by weight of propylene glycol monomethyl ether acetate, about 5 to about 20% by weight of propylene glycol monomethyl ether, about 3 to about 8% by weight of γ-butyrolactone, and about 5 to about 15% by weight of n-butyl acetate.

Some embodiments include pre-wetting the substrate with the thinner composition prior to coating the substrate with the photosensitive composition and baking the coating layer of the photosensitive composition to form a photosensitive film on the substrate, after removing a portion of the coating layer of the photosensitive composition from the substrate by applying the thinner composition to the substrate.

Some embodiments include baking the coating layer of the photosensitive composition to form a photosensitive film on the substrate, after removing a portion of the coating layer of the photosensitive composition from the substrate by applying the thinner composition to the substrate, detecting a defect existing on the photosensitive film, and removing the photosensitive film having the defect from the substrate by applying the thinner composition to the photosensitive film.

In some embodiments, the photosensitive composition is at least one selected from the group consisting of an I-line photoresist including a novolac-based resin, a KrF photoresist including poly(hydroxystyrene) partially protected by an acetal group or a tert-butyl carbonate group, an ArF photoresist including a (meth)acrylate-based resin, a KrF bottom anti-reflective coating including a triazine-based resin, and an ArF bottom anti-reflective coating including a polyester resin.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

FIG. 1 is a flow chart illustrating operations for forming a photosensitive film according some embodiments of the present invention.

DETAILED DESCRIPTION OF EXAMPLE EMBODIMENTS

Figure 2A:
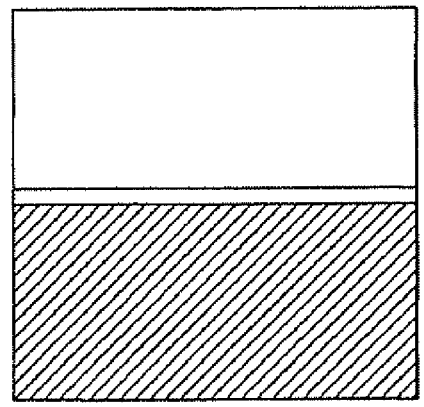
FIGS. 2A through 2D are schematic diagrams illustrating a boundary of a coating layer of a photosensitive composition to which an edge bead removal process is performed according to some embodiments of the present invention.

Example embodiments of the present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Thinner Composition

Some embodiments of the present invention may provide thinner compositions that have improved ability to dissolve various types of photosensitive materials, and may be useful for several steps of formation of a photosensitive film. Some embodiments of the present invention further provide thinner compositions that may reduce toxicity, corrosiveness and/or an unpleasant feeling for a human body, which may improve working stability. In some embodiments, the thinner compositions may include propylene glycol monomethyl ether acetate, propylene glycol monomethyl ether, γ-butyrolactone and/or n-butyl acetate.

The thinner composition may have excellent ability to dissolve various types of photosensitive materials (e.g., I-line photoresist, KrF photoresist, ArF photoresist, bottom anti-reflective coating (BARC), etc.) and improved edge bead removal (EBR) characteristics. While forming a photosensitive film using the photosensitive material, the thinner composition may be applied to an EBR process in which a photosensitive material attached to an edge and/or a backside of the substrate is removed, or may be employed in a rework process for removing an entire photosensitive film from a substrate. Further, the thinner composition may be used in a stripping process carried out for removing a photoresist pattern from a substrate after performing a developing process and an etching process. The thinner composition having excellent dissolving ability may be employed in a rinse process performed at a slow rotational speed due to using a large size wafer.

Additionally, the thinner composition may have proper volatility, surface tension or viscosity such that the thinner composition may be useful for pre-wetting a substrate before coating the substrate with a photosensitive material. The thinner composition may increase wetting ability of the substrate with respect to a photosensitive composition, and thus the thinner composition may improve thickness uniformity of a photosensitive film formed on the substrate and may also suppress generation of defects (e.g., cracks, tearing, etc.) on an edge portion of the photosensitive film.

Edge beads denote aggregation of a photosensitive material at an edge or a backside of the substrate. Edge beads may be formed by a centrifugal force while the substrate is spin-coated with the photosensitive material. The edge beads may include contaminants that may cause defects of a semiconductor device and/or malfunction of manufacturing equipment, or may be a defocus factor of an exposure process. Good EBR characteristics mean that edge beads are readily removed from an edge or a backside of the substrate without causing damage to a photosensitive film formed on a front of the substrate, and a boundary line of the photosensitive film at an edge portion of the substrate may become clear and uniform after removing the edge beads from the substrate.

Ethylene glycol monoethyl ether acetate may be used in a conventional thinner composition and may have a good ability to dissolve photoresist, but may also have high volatility, high flammability and/or biological toxicity (e.g., causing leucopenia or miscarriage). Ethyl lactate having a relatively high viscosity and a relatively low dissolving rate for photoresist may not sufficiently improve cleaning ability of a thinner composition. A mixed solvent of pyruvic acid alkyl-based solvent and methyl ethyl ketone may deteriorate solubility of a thinner composition to a 1,2-naphthaquinone diazide-based photosensitive agent. A mixed solvent of propylene glycol alkyl ether propionate and butyl acetate, which may have relatively high volatility, may cool down a substrate while cleaning a backside of the substrate with the mixed solvent, so a thickness variation of a photosensitive film formed on a front side of the substrate may detrimentally increase due to a temperature variation of the substrate. A mixed solvent of ethyl lactate and methyl ethyl ketone, which has a relatively low volatility, may have a poor ability to remove edge beads at an edge portion of a substrate. A thinner composition including methyl pyruvate, ethyl pyruvate, etc., may corrode metal components of a waste bath equipped in a photoresist spin-coater after a long time usage.

Propylene glycol monomethyl ether acetate (PGMEA) may have a good ability to dissolve a variety of photoresist, and also proper (i.e., not too high and not too low) volatility, surface tension and viscosity. PGMEA may have a relatively low dissolving rate for a photoresist (e.g., an ArF photoresist containing a (meth)acrylate-based resin). As the amount of PGMEA increases in the thinner composition, EBR characteristics of the thinner composition for a photoresist may deteriorate. In this regard, a coating uniformity of a photosensitive film formed on a substrate which is pre-wetted by the thinner composition may become worse.

In some embodiments, when the amount of PGMEA exceeds about 90% by weight, EBR characteristics of the thinner composition and/or a uniformity of a photosensitive film with regard to a photoresist (e.g., an ArF photoresist) may deteriorate due to its poor dissolving ability for the photoresist. When the amount of PGMEA is less than about 50% by weight, amounts of volatile components (e.g., n-butyl acetate or propylene glycol monomethyl ether) relatively may increase. In this regard, the volatile thinner composition may poorly wet a surface of a substrate. When a photosensitive film is formed on the substrate pre-wetted by such a volatile thinner composition, the thinner composition may not effectively assist a photosensitive resin composition to uniformly spread over the substrate. Accordingly, a defect (e.g., edge crack, tear or rupture) of the photosensitive film may be generated. In some embodiments, the amount of PGMEA may be in a range of about 50 to about 90% by weight. In some further embodiments, the amount of PGMEA is in a range of about 55 to about 80% by weight. In yet further embodiments, the amount of PGMEA is in a range of about 60 to about 80% by weight.

Propylene glycol monomethyl ether (PGME) has excellent ability to dissolve a variety of photoresist (e.g., including an acrylate-based ArF photoresist). Thus, the thinner composition may have an improved ability to dissolve the photoresist, as the amount of PGME increases in the thinner composition. However, PGME may have high volatility, and thus a large amount of PGME may cause a thickness variation and/or lifting of a photosensitive film due to its poor wetting ability.

For example, when the amount of PGME is less than about 1% by weight, the dissolving ability of the thinner composition for a photoresist (e.g., an ArF photoresist) may be reduced. Thus, EBR characteristics for the photoresist may decrease, and a photosensitive film having any defects may not be readily removed during a rework process. When the amount of PGME exceeds about 20% by weight, volatility of the thinner composition may increase, and thus a photosensitive film formed on a pre-wetted substrate may have a large thickness variation and a non-uniform coating. In some embodiments, the amount of PGME included in the thinner composition may be in a range of about 1 to about 20% by weight. In further embodiments, the amount of PGME is in range of about 5 to about 20% by weight, or in a range of about 5 to about 15% by weight.

Gamma (γ)-butyrolactone (GBL) included in the thinner composition may have good ability to dissolve various photosensitive materials. For example, GBL may have good dissolving ability for a KrF photoresist including poly(hydroxystyrene) protected by a t-butyl carbonate group. As the amount of GBL increases, the thinner composition may have the improved ability to dissolve various types of photoresist including the KrF photoresist. However, GBL may have a relatively high surface tension and viscosity, which may be obstacles in uniformly spreading the thinner composition over a surface of a substrate during a pre-wetting process. GBL may also have a relatively low volatility, so GBL may remain in a coating layer of a photosensitive resin composition formed on a pre-wetted substrate. The remaining portion of GBL may be organic contaminants, or may partially dissolve the photosensitive film to cause damage or defect of the photosensitive film.

For example, when the amount of GBL is greater than about 10% by weight, the thinner composition may have relatively high viscosity and surface tension. Thus, the thinner composition may have a reduced ability to clearly remove edge beads or may cause a tailing of a photosensitive film at edge portions. When the amount of GBL is less than about 1% by weight, the thinner composition may have a reduced ability to dissolve a poly(hydroxystyrene)-based KrF photoresist. In some embodiments, the amount of GBL is in a range of about 1 to about 10% by weight. In further embodiments, the amount of GBL may be in a range of about 3 to about 8% by weight.

Normal-butyl acetate (nBA) included in the thinner composition may have good dissolving ability for a KrF photoresist including poly(hydroxystyrene) protected by a t-butyl carbonate group. Further, nBA may have high volatility, low surface tension and low viscosity, and thus a thinner composition including a proper amount of nBA may effectively remove edge beads from a substrate and may improve uniformity of a photosensitive film formed on a pre-wetted substrate. However, nBA may have a poor ability to dissolve a (meth)acrylate-based ArF photoresist, and nBA may have relatively high volatility such that wettability of a thinner composition to a substrate may be reduced and a large thickness variation or lifting of a photosensitive film formed on a pre-wetted substrate may be generated.

For example, when the amount of nBA is greater than about 20% by weight, volatility of the thinner composition may largely increase, and the coating ability or the wetting ability of the thinner composition may deteriorate. When the amount of nBA is less than about 1% by weight, the thinner composition may have a reduced dissolving rate for the poly(hydroxystyrene)-based KrF photoresist and a reduced removability of edge beads. In some embodiments, the amount of nBA may be in a range of about 1 to about 20% by weight. In further embodiments, the amount of nBA may be in a range of about 5 to about 20% by weight, or in a range of about 5 to about 15% by weight.

When volatility of a thinner composition is excessively high, a substrate treated or wetted with the thinner composition may rapidly cool down, so a large thickness variation of a photosensitive film formed on the pre-wetted substrate may occur. When volatility of a thinner composition is very low, an excessive amount of the thinner composition may remain on a substrate after performing a pre-wetting process. In this regard, a photosensitive film formed on the pre-wetted substrate may be partially dissolved in the remaining thinner composition and may generate a defect or a blurred portion of the photosensitive film. After performing an EBR process, a portion of the thinner composition may remain on a substrate to form contaminants. In some embodiments, the thinner composition may have the relative volatility of about 0.2 to about 0.8, based on the volatility of nBA.

In some embodiments, the thinner composition may include a surfactant. The surfactant may improve abilities for the thinner composition to dissolve photoresist and/or to remove edge beads. Examples of surfactants may include a fluorine-based surfactant, a non-ionic surfactant and/or an ionic surfactant. Some embodiments provide that the amount of the surfactant may be in a range of about 10 ppm to about 500 ppm, based on a total weight of the thinner composition.

Methods of Forming a Photosensitive Film

Reference is now made to FIG. 1, which is a flow chart illustrating operations for forming a photosensitive film according to some embodiments of the present invention. A substrate on which a photosensitive film will be formed may be pre-wetted with a thinner composition according to example embodiments (block 110). Some embodiments provide that the thinner composition may include PGMEA, PGME, GBL and nBA. The thinner composition may increase wettability of the substrate before forming a photosensitive film on the substrate.

The substrate may be a substrate which may be employed in fabricating an electronic device such as a semiconductor memory device, an integrated circuit device or a thin film transistor-liquid crystal display (TFT-LCD) device, Various structures for manufacturing the electronic device may be formed on the substrate. For example, an insulation layer, a conductive layer, a wiring, a hole, a plug, a pad, a gate, a capacitor, and/or a conductive region, among others may be formed on the substrate. Some embodiments provide that an upper face of the substrate may have a stepped portion due to the structures.

The pre-wetting process may be performed by spin-coating the substrate with the thinner composition. In some embodiments, the thinner composition is dropped on the substrate, and then the thinner composition is distributed into an entire upper face (or front face) of the substrate by rotating the substrate. In some embodiments, the substrate is coated with the thinner composition by dropping the thinner composition on a rotating substrate. For example, the substrate may rotate at a speed of about 300 rpm to about 3,000 rpm while coating the substrate with the thinner composition.

When volatility of the thinner composition used in the pre-wetting process is excessively high, the substrate treated or wetted with the thinner composition may rapidly cool down, which may result in a large thickness variation of a photosensitive film formed on the pre-wetted substrate. When volatility of the thinner composition is very low, an excessive amount of the thinner composition may remain on a substrate after performing the pre-wetting process, so a photosensitive film formed on the pre-wetted substrate may be partially dissolved in the remaining thinner composition which may generate a defect and/or a blurred portion of the photosensitive film. In some embodiments, the thinner composition may have the relative volatility of about 0.2 to about 0.8, based on the volatility of nBA.

Further, when the thinner composition used in the pre-wetting process has excessively high surface tension, high viscosity and/or poor dissolving ability for a photosensitive resin composition, a thickness variation of the photosensitive film may also increase.

In some embodiments, the thinner composition used in the pre-wetting process may include about 50 to about 90 wt % of PGMEA, about 1 to about 20 wt % of PGME, about 1 to about 10 wt % of GBL and about 1 to about 20 wt % of nBA. In some embodiments, the thinner composition may include about 60 to about 80 wt % of PGMEA, about 5 to about 20 wt % of PGME, about 3 to about 8 wt % of GBL and/or about 5 to about 15 wt % of nBA.

When the amount of PGMEA exceeds about 90% by weight, the thinner composition may have a reduced dissolving ability for a photoresist (e.g., an ArF photoresist having a (meth)acrylate-based resin), so uniformity of a photosensitive film formed using the ArF photoresist may deteriorate. When the amount of PGMEA is less than about 50% by weight, amounts of volatile components (e.g., nSA or PGME) relatively may increase, so the thinner composition may poorly wet a surface of a substrate and the thinner composition may not effectively assist a photosensitive resin composition to uniformly spread over the substrate, possibly causing a defect (e.g., edge crack, tear or rupture) of the photosensitive film.

When the amount of PGME is less than about 1% by weight, the dissolving ability of the thinner composition for a photoresist (e.g., an ArF photoresist) may be reduced. When the amount of PGME exceeds about 20% by weight, volatility of the thinner composition may increase, and thus a photosensitive film formed on a pre-wetted substrate may have a large thickness variation and a non-uniform coating.

GBL may have a relatively high surface tension and viscosity, and thus a thickness variation of a photosensitive film formed on a pre-wetted substrate may increase as the amount of GBL increases. When the amount of GBL is greater than about 10% by weight (for example, about 20 wt %), a thickness variation of a photosensitive film may largely increase. When the amount of GBL is less than about 1% by weight, the thinner composition may have a reduced ability to dissolve a photoresist (e.g., a KrF photoresist having a poly(hydroxystyrene)-based resin), so a thickness variation of a photoresist film may also increase.

When the amount of nBA having high volatility is relatively great (for example, about 20 wt %), the thinner composition may very rapidly vaporize, which may deteriorate coating ability and/or wettability of the thinner composition to the substrate.

Referring to FIG. 1, a coating layer of a photosensitive resin composition may be formed on the substrate wetted by the thinner composition (block 120). The thinner composition may increase wettability of the substrate, and thus the photosensitive resin composition may be uniformly coated on the substrate. Additionally, a thin coating layer may be obtained using a reduced amount of the photosensitive resin composition. By performing a pre-wetting process, the photosensitive resin composition may uniformly spread out on the substrate while covering a stepped portion of the substrate originated by fine patterns and reducing a defect Or a thickness variation of a photosensitive film.

The photosensitive resin composition may be various photoresist compositions or compositions for anti-reflective coating. Examples of the photosensitive resin composition may include an I-line photoresist including a novolac-based resin, a KrF photoresist including poly(hydroxystyrene) partially protected by an acetal group or a tert-butyl carbonate group, an ArF photoresist including a (meth)acrylate-based resin, a KrF bottom anti-reflective coating including a triazine-based resin, and/or an ArF bottom anti-reflective coating including a polyester resin.

By way of example, the I-line photoresist may include a novolac resin and 2,4-dinitroquinone as a photosensitive agent. The KrF photoresist may include poly(hydroxystyrene) partially protected by a blocking group, and/or a triphenylsulfonium salt as a photosensitive agent. The ArF photoresist may include poly(methacrylate) protected by an adamantyl group or 4-oxa-tricyclo(4.2.1.0(3,7))nonan-5-one, and/or a triphenylsulfonium salt.

In some embodiments, the coating layer of the photosensitive resin composition may be formed by a spin-coating process. During the spin-coating process, edge beads, which may be spherical aggregation of the photosensitive resin composition at an edge or a backside of the substrate, may be generated by a centrifugal force. The edge beads may be contaminants that may cause defects of a semiconductor device and/or malfunction of manufacturing equipments, or may be a defocus factor of an exposure process.

Referring to FIG. 1, at least a portion of the coating layer of the photosensitive resin composition may be removed from the substrate using a thinner composition according to example embodiments (block 130). For example, edge beads and/or the coating layer at an edge and/or a backside of the substrate may be removed by the thinner composition. The thinner composition may include PGMEA, PGME, GBL and nBA.

In some embodiments, removing edge beads or the coating layer at the edge or the backside may be performed by spraying the thinner composition to the substrate under a pressurized condition while rotating the substrate. For example, the thinner composition may be sprayed at a flow rate of about 5 to about 50 mL/min. The thinner composition may be sprayed from a pressure tank having a pressure of about 0.5 to about 3 kgf. In the edge bead removal (EBR) process, the substrate may rotate at a speed of about 300 to about 3,000 rpm.

Figure 2B:
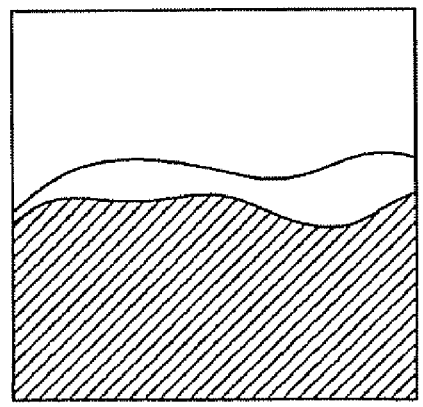
Figure 2C:
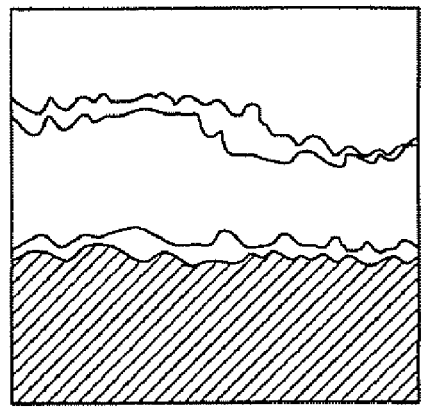
Figure 2D:
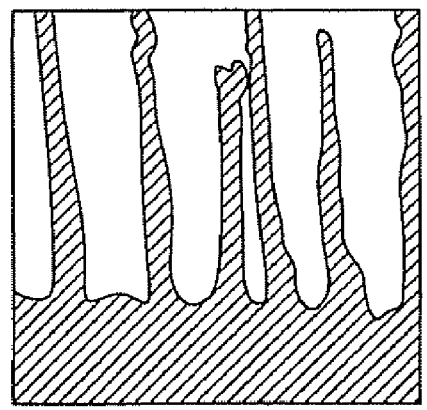

FIGS. 2A through 2D are schematic diagrams illustrating a boundary of a coating layer of a photosensitive resin composition to which an EBR process is performed according to some embodiments of the present invention. Reference is now made to FIG. 2A, which illustrates a clear and uniform boundary line of the coating layer of the photosensitive resin composition after performing the EBR process. Referring to FIG. 2B and FIG. 2C, which illustrate blurred, irregular or non-linear boundary of the coating layer of the photosensitive resin composition after performing the EBR process. FIG. 2D illustrates a tailing at an edge or a boundary of the coating layer of the photosensitive resin composition after performing the EBR process.

The thinner composition according to embodiments described herein may include excellent abilities to dissolve various types of photosensitive materials (e.g., I-line photoresist, KrF photoresist, ArF photoresist, bottom anti-reflective coating (BARC), etc.). Further, the thinner composition may have volatility, surface tension and viscosity characteristics that may be beneficial to the EBR process. Thus, as illustrated in FIG. 2A, the thinner composition may selectively remove edge beads from the substrate without causing damage to a center portion of the coating layer and may produce a clear boundary line of the coating layer. When the thinner composition has a poor dissolving ability for the photosensitive resin composition, high viscosity and/or high surface tension, non-uniform and/or unclear boundary lines of the coating layer may be obtained as illustrated in FIGS. 2B and 2C. Additionally, a tailing at the boundary of the coating layer may occur as shown in FIG. 2D.

When the volatility of the thinner composition used in the EBR process is excessively high, the thinner composition may readily evaporate in a working space to reduce cleanliness of semiconductor fabrication equipment and/or increase hazards for a human body. When the volatility of the thinner composition is too low, the thinner composition may remain on the substrate after performing the EBR process and may contaminate the substrate and/or fabrication equipment.

In some embodiments, the thinner composition used in the EBR process may include about 50 to about 90 wt % of PGMEA, about 1 to about 20 wt % of PGME, about 1 to about 10 wt % of GBL and about 1 to about 20 wt % of nBA. In some embodiments, the thinner composition used in the EBR process may include about 60 to about 80 wt % of PGMEA, about 5 to about 20 wt % of PGME, about 3 to about 8 wt % of GBL and about 5 to about 15 wt % of nBA.

For example, when the amount of PGMEA exceeds about 90% by weight, the thinner composition may have a reduced dissolving ability for a photoresist (e.g., a (meth)acrylate-based ArF photoresist), and thus a non-uniform boundary and/or a tailing of the coating layer may be generated. When the amount of PGMEA is less than about 50% by weight, volatility of the thinner composition may excessively increase since the amount of other volatile components (e.g., nBA or PGME) increases.

When the amount of PGME is less than about 1 wt %, the thinner composition may have a reduced ability to dissolve a photoresist (e.g., an ArF photoresist having a (meth)acrylate resin), so a boundary line of the coating layer at an edge of the substrate may be blurred and/or a tailing phenomenon may occur at an edge of the coating layer. When the amount of PGME is greater than about 20 wt %, volatility of the thinner composition may excessively increase.

When the amount of GBL is greater than about 10 wt %, the thinner composition may have relatively high viscosity, high surface tension and low volatility, so a tailing of the coating layer at an edge or a boundary may occur. When the amount of GBL is less than about 1 wt %, solubility of a photoresist (e.g., a KrF photoresist having poly(hydroxystyrene) protected by t-butyl carbonate group) in the thinner composition may greatly reduce, and thus the boundary of the coating layer at the edge may be blurred after performing the EBR process.

When the amount of nBA is greater than about 20 wt %, volatility of the thinner composition may excessively increase. When the amount of nBA is less than about 1 wt %, the solubility of a photoresist (e.g., a KrF photoresist having poly(hydroxystyrene) protected by t-butyl carbonate group) may decrease.

In some embodiments, the thinner composition used in the EBR process may be the same as the thinner composition employed in the pre-wetting process. In some embodiments, the thinner compositions of the EBR process and the pre-wetting process may have a different ratio of components.

Referring again to FIG. 1, the coating layer of the photosensitive resin composition is softly baked to form a photosensitive film on the substrate after removing edge beads from an edge or a backside of the substrate (block 140). While performing a soft-baking process, solvent or moiety may be removed from the coating layer.

Thereafter, absence or existence of a defect on the photosensitive film may be confirmed using an apparatus for detecting a defect (block 150). When no defect is observed in the photosensitive film, an exposure process (block 180) and a developing process (block 190) may be performed on the photosensitive film to form a photosensitive pattern.

When a defect (e.g., tearing, tailing, blurred boundary line and/or thickness variation) of the photosensitive film is observed, a rework process may be carried out. The photosensitive film may be removed from the substrate (block 160) and then a new photosensitive film may be formed on the substrate. Removing the photosensitive film from the substrate may be performed using a thinner composition according to example embodiments. The thinner composition used in the rework process may include PGMEA, PGME, GBL and/or nBA. The thinner composition may have excellent ability to dissolve the baked photosensitive film, so the thinner composition may effectively remove the photosensitive film from the substrate within a relatively short time.

In some embodiments, the thinner composition used in the rework process may be the same as the thinner composition employed in the pre-wetting process and/or the EBR process. In some embodiments, the thinner composition used in the rework process may have a different ratio of components from the thinner compositions used in the pre-wetting process and/or the EBR process.

After removing the photosensitive film having a defect from the substrate, the substrate may be cleaned and dried (block 170). Thereafter, the pre-wetting process (block 110), the coating process of the photosensitive resin composition (block 120), the EBR process (block 130), the soft-baking process (block 140), the exposure process (block 180) and the developing process (block 190) may be performed to form a photosensitive pattern having no defect on the substrate.

Some embodiments for a thinner composition and a method of forming a photosensitive film will be described hereinafter with reference to Examples and Comparative Examples. These are illustrative of example embodiments are not intended to be limiting of the present invention.

EXAMPLES

Preparation of a Thinner Composition

Example 1

A thinner composition was prepared by mixing about 55 wt % of propylene glycol monomethyl ether acetate (PGMEA), about 20 wt % of propylene glycol monomethyl ether (PGME), about 5 wt % of γ-butyrolactone (GBL) and about 20 wt % of n-butyl acetate (nBA) in a stirring bath for about 1 hour at a speed of about 500 rpm.

Examples 2 through 5 and Comparative Examples 1 through 11

A thinner composition was prepared using methods substantially the same as methods of Example 1 except that amounts of the components were changed. Components and amounts used for preparing each thinner composition are shown in Table 1 below. In Table 1, the unit of amount is percent by weight.

TABLE 1

|  | PGMEA | PGME | GBL | nBA |
|---|---|---|---|---|
| Example 1 | 55 | 20 | 5 | 20 |
| Example 2 | 65 | 10 | 5 | 20 |
| Example 3 | 65 | 20 | 5 | 10 |
| Example 4 | 75 | 10 | 5 | 10 |
| Example 5 | 85 | 5 | 5 | 5 |
| Comparative Example 1 | 35 | 30 | 5 | 30 |
| Comparative Example 2 | 60 | 20 | — | 20 |
| Comparative Example 3 | 65 | 30 | 5 | — |
| Comparative Example 4 | 65 | — | 5 | 30 |
| Comparative Example 5 | 50 | 30 | 5 | 15 |
| Comparative Example 6 | 50 | 15 | 5 | 30 |
| Comparative Example 7 | 50 | 15 | 20 | 15 |
| Comparative Example 8 | 100 | — | — | — |
| Comparative Example 9 | — | 100 | — | — |
| Comparative Example 10 | — | — | 100 | — |
| Comparative Example 11 | — | — | — | 100 |

Properties of propylene glycol monomethyl ether acetate (PGMEA), propylene glycol monomethyl ether (PGME), γ-butyrolactone (GBL) and n-butyl acetate (nBA), which were used in Comparative Examples 8 through 11 respectively, were analyzed. Boiling point, surface tension, vapor pressure and viscosity of each solvent are shown in Table 2 below.

TABLE 2

|  | Boiling Point [° C.] | Surface Tension [mN/m] | Vapor Pressure [mmHg] | Viscosity [cps, 25° C.] |
|---|---|---|---|---|
| PGMEA | 146 | 28.5 | 3.8 (25° C.) | 1.3 |
| PGME | 119 | 28.1 | 7.6 (20° C.) | 1.75 |
| GBL | 204 | 44.9 | 10 (79° C.) | 1.7 |
| nBA | 125 | 25.6 | 7.8 (20° C.) | 0.734 |

Experiment 1

Evaluation of EBR Characteristics with Respect to Types of Photosensitive Materials A coating layer of a photosensitive resin composition was formed on a 4-inch silicon wafer by a spin-coating method. As the photosensitive resin composition, an I-line photoresist, a KrF photoresist, an ArF photoresist, a KrF bottom anti-reflective coating (BARC) and an ArF BARC were used. Types of the photosensitive resin composition and thicknesses of the coating layer were shown in Table 3.

TABLE 3

| Photosensitive Resin Composition | Resin | Thickness [μm] |
|---|---|---|
| PR 1 I-line PR | Novolac | 1.10 |
| PR 2 KrF PR | Acetal-protected PHS | 1.30 |
| PR 3 KrF PR | t-butylcarbonate-protected PHS | 0.89 |
| PR 4 ArF PR | methacrylate | 0.25 |
| PR 5 KrF BARC | triazine | 0.06 |
| PR 6 ArF BARC | polyester | 0.04 |

In Table 3, the I-line photoresist (PR 1) was a photoresist including a novolac-based resin, the KrF photoresist (PR 2) was a photoresist including poly(hydroxystyrene) (PHS) in which hydroxyl groups were partially blocked by acetal groups, the KrF photoresist (PR 3) was a photoresist including poly(hydroxystyrene) in which hydroxyl groups were partially blocked by tert-butylcarbonate groups, and the ArF photoresist (PR 4) was a photoresist including a methacrylate resin protected by an adamantyl group. Additionally, the KrF BARC (PR 5) included a triazine-based resin, and the ArF BARC (PR 6) included an ester-based resin.

After forming the coating layer of the photosensitive resin composition on the silicon wafer by a spin-coating, an EBR process was performed using each of the thinner compositions prepared in Examples 1 through 5 and Comparative Examples 1 through 11 to remove edge beads or a portion of the coating layer positioned on an edge or a backside of the silicon wafer. The thinner composition was provided from a pressure tank in which a pressure gas was installed. The pressure level of the tank was adjusted to about 1 kgf. The flow rate of the thinner composition flowing out from an EBR nozzle was about 10 to about 30 cc/min. While the wafer rotated at a speed of about 2,000 rpm, the thinner composition was sprayed to the edge and the backside of the wafer for about 20 seconds. Thereafter, the wafer was dried for about 6 seconds with rotating at a speed of about 1,300 rpm. After performing the EBR process on the wafer having the coating layer of the photosensitive resin composition, the wafer was observed using an optical microscope and a scanning electron microscope (SEM) to determine whether an undesired portion of the coating layer at the edge of the wafer was removed. The results of the EBR characteristics are shown in Table 4 below.

TABLE 4

|  | PR 1 | PR 2 | PR 3 | PR 4 | RR 5 | PR 6 |
|---|---|---|---|---|---|---|
| Example 1 | ⊚ | ⊚ | ⊚ | ⊚ | ⊚ | ○ |
| Example 2 | ⊚ | ⊚ | ⊚ | ⊚ | ⊚ | ○ |
| Example 3 | ⊚ | ⊚ | ⊚ | ⊚ | ⊚ | ○ |
| Example 4 | ⊚ | ⊚ | ⊚ | ⊚ | ⊚ | ○ |
| Example 5 | ⊚ | ⊚ | ○ | ○ | ○ | ○ |
| Comparative Example 1 | Δ | ○ | ⊚ | Δ | ○ | ○ |
| Comparative Example 2 | ○ | ○ | X | Δ | ○ | Δ |
| Comparative Example 3 | ○ | ○ | Δ | Δ | Δ | Δ |
| Comparative Example 4 | ○ | Δ | Δ | Δ | Δ | Δ |
| Comparative Example 5 | ⊚ | ○ | Δ | ⊚ | ○ | Δ |
| Comparative Example 6 | Δ | ⊚ | ⊚ | ⊚ | ○ | Δ |
| Comparative Example 7 | X | X | X | X | X | X |
| Comparative Example 8 | ○ | ○ | Δ | X | Δ | X |
| Comparative Example 9 | ○ | Δ | Δ | X | Δ | X |
| Comparative Example 10 | X | X | X | X | X | X |
| Comparative Example 11 | Δ | Δ | ○ | X | Δ | X |

In Table 4, "⊚" denotes that edge beads are clearly removed by the EBR process and the boundary of the coating layer at the edge of the wafer has a distinct and uniform line shape, "O" indicates that the boundary of the coating layer has a line shape at about 75% or more portions of the boundary, "Δ" means that the boundary of the coating layer is blurred to have no distinct line shape, and "X" represents that edge beads remain on the wafer or a tailing of the coating layer at the edge of the coating layer occurs.

As shown in Table 4, it was confirmed that the thinner compositions prepared in Examples 1 through 5 may have excellent or good ability to remove edge beads generated from various types of photosensitive compositions.

The thinner compositions prepared in Examples 1 through 4 clearly removed edge beads generated from four types of photoresist (PR 1 through PR 4) and BARC (PR 5) and formed a uniform boundary line of the coating layer. Further, the thinner compositions prepared in Examples 1 through 4 removed edge beads of BARC (PR 6) and maintained a line shape of the boundary of the coating layer over 75%. The thinner composition prepared in Example 5 clearly removed edge beads of PR 1 and PR 2, and maintained a line shape of the boundary of the coating layer over 75% for PR-3 through PR-6. However, the thinner compositions prepared in Comparative Examples 1 through 11 did not clearly remove edge beads and/or produced a blurred or tailed boundary line for at least one or two photosensitive compositions.

Accordingly, it may be noted that the thinner compositions prepared in Examples 1 through 5 may have excellent EBR characteristics as being compared with the thinner compositions prepared in Comparative Examples, since edge beads are readily and clearly removed without causing damage to the boundary of the coating layer. It may also be noted that the thinner compositions of Examples 1 through 4 including about 55 to about 80 wt % of PGMEA may have better EBR characteristics with respect to various photosensitive films than those of the thinner composition of Example 5 including about 85 wt % of PGMEA It was observed that the thinner composition prepared in Comparative Example 1 including PGMEA of less than about 50 wt % (e.g., 35 wt %) may produce a blurred boundary line of the coating layer formed using PR 1 or PR 4. It was also observed that the thinner compositions including no PGME or nBA as prepared in Comparative Examples 3 and 4 may generate a blurred boundary line of the coating layer with respect to various types of photoresist, after performing an EBR process using the thinner composition.

It was confirmed that the thinner composition including no GBL prepared in Comparative Example 2 may have a greatly reduced ability to remove edge beads originated from a KrF photoresist (PR 3) containing poly(hydroxystyrene) protected by t-butyl carbonate. Further, it was also confirmed that the thinner composition including a large amount of GBL at least 20 wt % as prepared in Comparative Examples 7 and 10 may bring about a tailing of the coating layer at an edge, or spherical aggregation of the thinner composition during the EBR process, due to high surface tension of the thinner composition.

Experiment 2

Evaluation of a Dissolving Rate of a Photosensitive Film

Dissolving rates of various photosensitive films for the thinner compositions prepared in Examples 1 through 5 and Comparative Examples 1 through 11 were evaluated.

A photosensitive film was formed on a 6-inch silicon wafer by coating with each of the six types of the photosensitive resin compositions shown in Table 3. The photosensitive films formed using PR 1 through PR 4 were obtained by coating the wafer with each photoresist composition followed by a soft-backing process. The photosensitive films formed using PR 5 and PR 6 were obtained without performing a soft-baking process after coating. The photosensitive films (PR 1 to PR 6) were not exposed to light. While developing the photosensitive films (PR 1 to PR 6) using the thinner composition, the dissolving rates of the photosensitive films were measured using a Development Rate Monitor (DRM) instrument. The measured dissolving rates are shown in Table 5 below.

TABLE 5

|  | PR 1 | PR 2 | PR 3 | PR 4 | PR 5 | PR 6 |
|---|---|---|---|---|---|---|
| Example 1 | ⊚ | ⊚ | ⊚ | ○ | ⊚ | ⊚ |
| Example 2 | ⊚ | ⊚ | ⊚ | ○ | ⊚ | ⊚ |
| Example 3 | ⊚ | ⊚ | ⊚ | ⊚ | ⊚ | ⊚ |
| Example 4 | ⊚ | ⊚ | ⊚ | ⊚ | ⊚ | ⊚ |
| Example 5 | ○ | ⊚ | ○ | ○ | ⊚ | ⊚ |
| Comparative Example 1 | ○ | ⊚ | ⊚ | Δ | ⊚ | ⊚ |
| Comparative Example 2 | ⊚ | ⊚ | Δ | ○ | ⊚ | ⊚ |
| Comparative Example 3 | ⊚ | ⊚ | Δ | ○ | ⊚ | ⊚ |
| Comparative Example 4 | ○ | ⊚ | ⊚ | Δ | ⊚ | ⊚ |
| Comparative Example 5 | ⊚ | ⊚ | ⊚ | ⊚ | ⊚ | ⊚ |
| Comparative Example 6 | ○ | ⊚ | ⊚ | Δ | ⊚ | ⊚ |
| Comparative Example 7 | ⊚ | ⊚ | ⊚ | ⊚ | ⊚ | ⊚ |
| Comparative Example 8 | ○ | ⊚ | ○ | Δ | ⊚ | ⊚ |
| Comparative Example 9 | ⊚ | ⊚ | ⊚ | ⊚ | ⊚ | ⊚ |
| Comparative Example 10 | ⊚ | ⊚ | ⊚ | ○ | ⊚ | ⊚ |
| Comparative Example 11 | ○ | ○ | ⊚ | X | ⊚ | ⊚ |

In Table 5, "⊚" indicates a dissolving rate of at least about 700 nm/sec, "○" represents a dissolving rate of slower than about 700 nm/sec and at least about 400 nm/sec, "Δ" means a dissolving rate slower than about 400 nm/sec and at least about 100 nm/msec, and "X" denotes a dissolving rate slower than about 100 nm/sec.

As shown in Table 5, the thinner compositions prepared in Examples 1 through 5 had dissolving rates of at least about 700 nm/sec or at least about 400 nm/sec. For example, the thinner compositions prepared in Examples 3 and 4 showed rapid dissolving rates of at least about 700 nm/sec with respect to all six types of the photosensitive films.

The thinner compositions of Comparative Examples 8 and 11 consisting of a single component (PGMEA or nBA) showed reduced ability to dissolve a specific photoresist (e.g., an ArF photoresist of PR 4).

The thinner compositions of Comparative Examples 9 and 10 consisting of a single component (PGME or GBL) had good dissolving ability for various photoresists. However, the thinner compositions of Comparative Examples 9 and 10 had relatively poor EBR characteristics as shown in Table 4, since the boundary line (i.e., an EBR line) of the coating layer was blurred or a tailing of the coating layer at an edge occurred. Therefore, it may be noted that the dissolving rate of a photosensitive film may have influence on the EBR characteristics, however, a good dissolving rate may not ensure good EBR characteristics.

Figure 3:
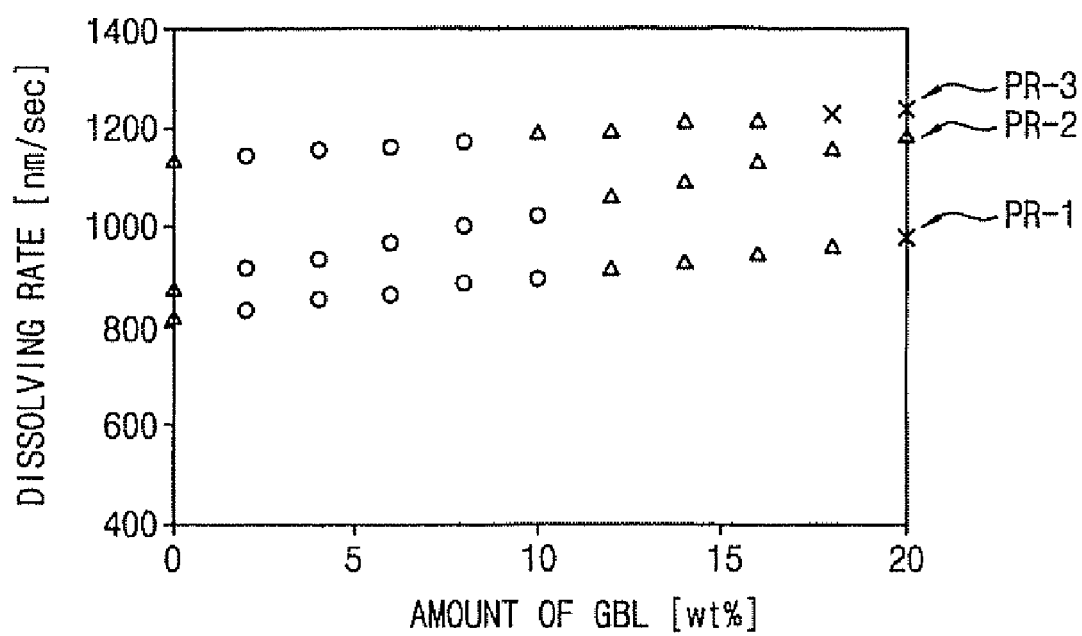
FIG. 3 is a graph illustrating variation of a dissolving rate of a photosensitive film and EBR characteristics according to the amount of γ-butyrolactone (GBL) according to some embodiments of the present invention.

Reference is no made to FIG. 3, which is a graph illustrating variation of a dissolving rate of a photosensitive film and EBR characteristics according to the amount of γ-butyrolactone (GBL) according to some embodiments of the present invention. In the experiment relating to FIG. 3, a dissolving rate of a photosensitive film was measured and an EBR process was performed, while the amounts of GBL and PGMEA were changed and the amounts of PGME and nBA were maintained constantly. The amount of PGME was about 10 wt %, and the amount of nBA was about 10 wt %. Total amounts of GBL, PGMEA, PGME and nBA satisfied about 100 wt %. The photosensitive film was formed using each of PR-1, PR-2 and PR-3.

In the EBR characteristics, "⊙" denotes that edge beads are clearly removed by the EBR process and the boundary of the coating layer at the edge of the wafer has a distinct and uniform line shape, "O" indicates that the boundary of the coating layer has a line shape at about 75% or more portions of the boundary, "Δ" means that the boundary of the coating layer is blurred to have almost no distinct line shape, and "X" represents that edge beads remain on the wafer or a tailing of the coating layer at the edge of the coating layer occurs.

Dissolving rates of PR-1, PR-2 and PR-3 gradually increased as the amount of GBL contained in the thinner composition increased from about 0 wt % to about 20 wt %. However, when the amount of GBL exceeded about 10 wt %, the boundary lines of the coating layers of PR-1, PR-2 and PR-3, on which EBR processes were performed, began to be blurred or did not have a line shape. Therefore, it may be noted that EBR characteristics of the thinner composition may be improved by adjusting the amount of GBL in a range of greater than about 0 wt % (for example, at least about 1 wt %) and equal to or less than about 10 wt %.

Experiment 3

Evaluation of a Coating Uniformity for Various Photosensitive Films

Coating uniformity of a photosensitive film formed on a wafer pre-wetted by each of the thinner compositions prepared in Examples 1 through 5 and Comparative Examples 1 through 11 was evaluated. Good coating uniformity may refer to a characteristic that a photosensitive film or a coating layer of a photosensitive resin composition is formed with a uniform thickness. A wafer was wetted by a thinner composition, and then a coating layer of a photosensitive resin composition was formed on the pre-wetted wafer. In a wafer, a thickness variation of the coating layer was measured.

For example, the thinner composition was provided onto a 6-inch silicon wafer to which an oxidation treatment was carried out. A coating layer of each of the photosensitive resin compositions (PR 1 through PR 6) was formed on the silicon wafer by a spin-coating process. A thickness of the coating layer was measured at nine points of the wafer, which included one point of a center, and eight other points that were 1 inch or 2 inches from the center point in a substantially X-shaped arrangement. Process conditions relating to the formation of the coating layer are shown in Table 6 below. Further, the results relating to the thickness uniformity of the coating layer are shown in Table 7.

TABLE 6

| | Time [sec] | Rotational Speed [rpm] | Composition [cc] |
|---|---|---|---|
| 1 | 5 | 0 | 2.0 (Thinner: Prewetting) |
| 2 | 5 | 700 | — |
| 3 | 3 | 2,500 | — |
| 4 | 20 | 2,500 | 0.3 (PR: Coating) |
| 5 | 5 | 700 | — |
| 6 | 5 | 0 | — |

TABLE 7

| | PR 1 | PR 2 | PR 3 | PR 4 | PR 5 | PR 6 |
|---|---|---|---|---|---|---|
| Example 1 | ⊙ | ⊙ | ⊙ | ⊙ | ⊙ | O |
| Example 2 | ⊙ | ⊙ | ⊙ | ⊙ | ⊙ | O |
| Example 3 | ⊙ | ⊙ | ⊙ | ⊙ | ⊙ | ⊙ |
| Example 4 | ⊙ | ⊙ | ⊙ | ⊙ | ⊙ | ⊙ |
| Example 5 | ⊙ | ⊙ | ⊙ | ⊙ | ⊙ | ⊙ |
| Comparative Example 1 | Δ | O | O | Δ | O | Δ |
| Comparative Example 2 | Δ | O | O | Δ | O | Δ |
| Comparative Example 3 | Δ | O | O | Δ | O | Δ |
| Comparative Example 4 | Δ | O | O | Δ | O | Δ |
| Comparative Example 5 | Δ | O | O | Δ | ⊙ | Δ |
| Comparative Example 6 | Δ | O | O | Δ | O | Δ |
| Comparative Example 7 | X | Δ | Δ | X | Δ | Δ |
| Comparative Example 8 | O | ⊙ | O | Δ | O | O |
| Comparative Example 9 | O | ⊙ | O | O | O | O |
| Comparative Example 10 | X | O | Δ | X | Δ | Δ |
| Comparative Example 11 | Δ | ⊙ | O | O | O | O |

In Table 7, "⊙", indicates that a standard deviation of a film thickness is about 1% or less, "O" denotes that a standard deviation of a film thickness is from about 1% exclusive to about 2% inclusive, "Δ" means that a standard deviation of a film thickness is from about 2% exclusive to about 3% inclusive, and "X" represents that a standard deviation of a film thickness is larger than about 3%.

As shown in Table 7, the coating layer formed on the wafer pre-wetted by the thinner compositions of Examples 1 through 6 had a very small or slight thickness variation of about 1% or less, or about 2% or less. However, the coating layer formed on the wafer pre-wetted by the thinner compositions of Comparative Examples 1 through 11 had a relatively large thickness variation of greater than about 2% or about 3%. Therefore, it may be noted that the thinner composition prepared in Examples 1 through 6 may greatly improve a coating uniformity of a photosensitive film.

Experiment 4

Evaluation of Coating Ability of a Thinner Composition Relating to Volatility

Relative volatilities of the thinner compositions prepared in Examples 1, 4 and 5 and Comparative Examples 1, 10 and 11 were measured. Further, coating uniformity of a photosensitive film formed on a pre-wetted substrate was evaluated to analyze relation between volatility of the thinner composition and coating uniformity.

A sample was prepared by putting about 2 g of the thinner composition into a round silver plate, and then the sample was left alone at a room temperature under air. An amount change of the thinner composition contained in the plate was measured with the passage of time. Relative volatility of the thinner composition was evaluated by setting the evaporated amount of nBA to "1" as a basis and by comparing the evaporated amount of the thinner composition with the evaporated amount of nBA.

Further, a coating layer of PR 1 was formed on a wafer pre-wetted by each of the thinner compositions of Examples 1, 4 and 5 and Comparative Examples 1, 10 and 11 under process conditions shown in Table 6. Coating uniformity of the coating layer was evaluated using an optical microscope and SEM. The results are shown in Table 8.

TABLE 8

| | Relative Volatility | Coatability of Photosensitive Film |
|---|---|---|
| Example 1 | 0.800 | Slight stepped portion |
| Example 4 | 0.494 | Uniform coating with no stepped portion |
| Example 5 | 0.312 | Uniform coating with no stepped portion |
| Comparative Example 1 | 0.924 | Severe stepped portion and lifting |
| Comparative Example 10 | 0.005 | Dissolution of photoresist at center portion |
| Comparative Example 11 | 1.000 | Severe stepped portion and lifting |

Referring to Table 8, relative volatility of the thinner composition of Example 1 was measured to about 0.800. A faint pattern and a slight stepped portion were observed from the coating layer formed on the wafer pre-wetted by the thinner composition of Example 1. Relative volatilities of the thinner compositions of Examples 4 and 5 were about 0.494 and 0.312, respectively and no stepped portion of the coating layer was observed. It may be noted that such proper volatility of the thinner composition may produce uniform coating layer with no stepped portion. The thinner compositions of Comparative Examples 1 and 11 had very high relative volatility of about 0.924 and about 1.000, respectively, and a severe stepped portion or a lifting of the coating layer was observed. It may be noted that a thinner composition having relatively high volatility may not effectively improve wetting ability of the substrate to form a photosensitive film having poor coating uniformity. The thinner composition of Comparative Example 10, which had very low relative volatility of about 0.005, generated a dissolved portion of the photoresist film at a center due to a remaining portion of the thinner composition.

Figure 4:
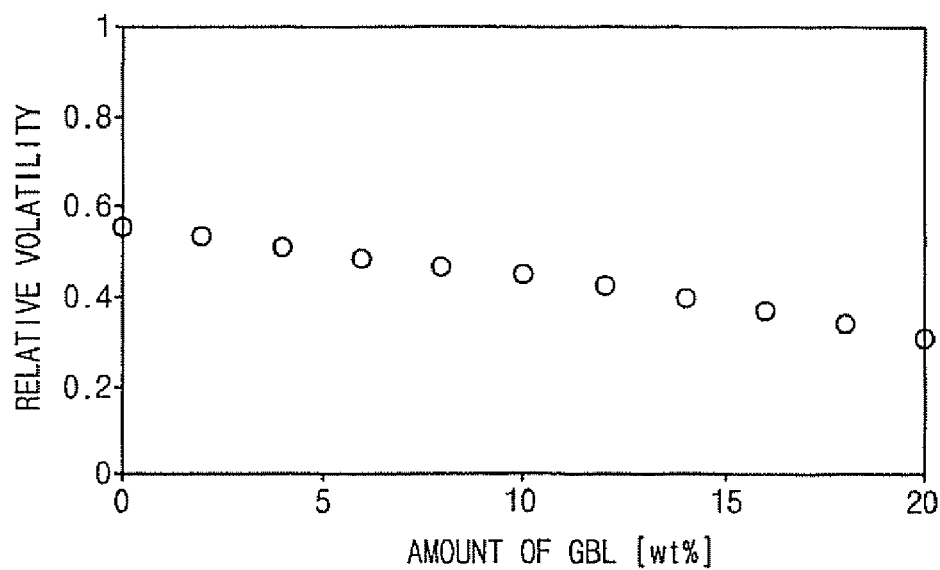
FIG. 4 is a graph illustrating variation of relative volatility of the thinner composition according to the amount of GBL according to some embodiments of the present invention.
Figure 5:
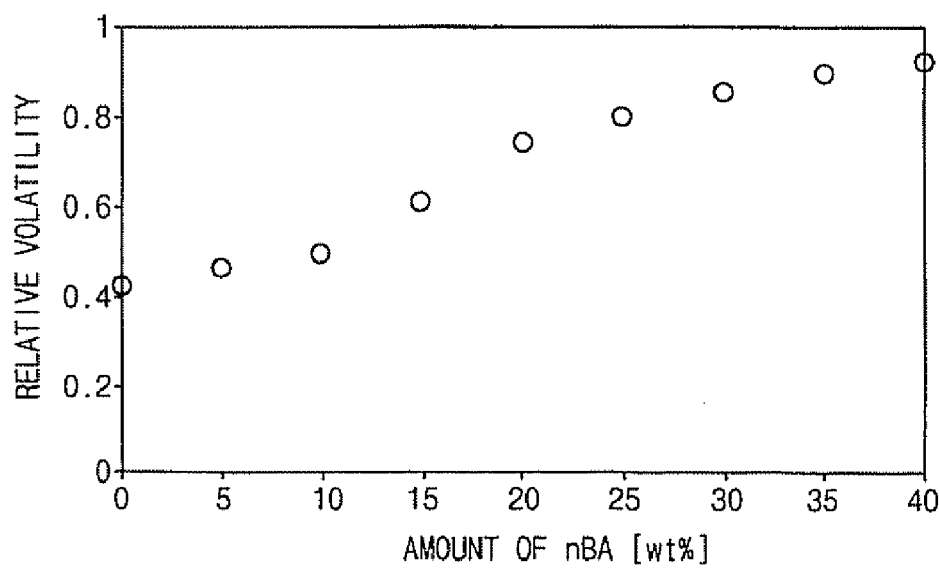
FIG. 5 is a graph illustrating variation of relative volatility of the thinner composition according to the amount of nBA according to some embodiments of the present invention.

FIG. 4 is a graph illustrating variation of relative volatility of the thinner composition according to the amount of GBL according to some embodiments of the present invention. FIG. 5 is a graph illustrating variation of relative volatility of the thinner composition according to the amount of nBA according to some embodiments of the present invention. In FIGS. 4 and 5, the relative volatility denotes a vaporization rate of the thinner composition when the vaporization rate of nBA is regarded as 1.

In the experiment relating to FIG. 4, relative volatility was evaluated, while the amounts of GBL and PGMEA were changed and the amounts of PGME and nBA were maintained constantly. The amount of PGME was about 10 wt %, and the amount of nBA was about 10 wt %. Total amounts of GBL, PGMEA, PGME and nBA were about 100 wt %. In the experiment relating to FIG. 5, relative volatility was evaluated, while the amounts of nBA and PGMEA were changed and the amounts of PGME and GBL were maintained constantly. The amount of PGME was about 10 wt %, and the amount of GBL was about 5 wt %.

As shown in FIG. 4, relative volatility of the thinner composition having no GBL (0 wt %) was about 0.56, and relative volatility of the thinner composition gradually decreased as the amount of GBL increased. When the amount of GBL was about 20 wt %, the relative volatility was measured to about 0.30.

As illustrated in FIG. 5, relative volatility of the thinner composition having no nBA (0 wt %) was about 0.42 and relative volatility of the thinner composition also increased as the amount of nBA increased. When the amount of nBA exceeded about 25 wt %, the relative volatility was higher than about 0.8. It was confirmed that the thinner composition having such high volatility generated a stepped portion of a photoresist film (PR 1) due to reduced wetting ability. The thinner composition including nBA of greater than about 30 wt % produced severe stepped portion or a lifting of the photoresist film. Accordingly, it may be noted that a thinner composition including nBA of about 20 wt % or less, or a thinner composition having relative volatility of about 0.8 or less, may have an improve ability to wet a substrate and may produce a photoresist film having enhanced coating uniformity.

According to example embodiments, the thinner composition may have excellent dissolving ability with respect to various photosensitive materials (e.g., I-line photoresist, KrF photoresist or ArF photoresist, KrF BARC or ArF BARC). The thinner composition may have proper characteristics (e.g., volatility, surface tension or viscosity) such that the thinner composition may clearly remove edge beads from an edge or a backside of a substrate without causing damage to a photosensitive film on a front of the substrate. The thinner composition may also be employed in removing a photosensitive film having any defect from a substrate for a rework process. Additionally, the thinner composition may be useful for pre-wetting a substrate before coating the substrate with a photosensitive material such that a photosensitive film formed on the pre-wetted substrate may have improved coating uniformity.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to he understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method of forming a photosensitive film, comprising:
pre-wetting the substrate with a thinner composition prior to coating the substrate with the photosensitive composition;
coating a substrate with a photosensitive composition to form a coating layer of the photosensitive composition on a substrate;
removing a portion of the coating layer of the photosensitive composition from the substrate by applying the thinner composition to the substrate;
baking the coating layer of the photosensitive composition to form a photosensitive film on the substrate, after removing a portion of the coating layer of the photosensitive composition from the substrate by applying the thinner composition to the substrate;
detecting a defect existing on the photosensitive film; and
removing the photosensitive film having the defect from the substrate by applying the thinner composition to the photosensitive film, the thinner composition including about 50 to about 90% by weight of propylene glycol monomethyl ether acetate, about 1 to about 20% by weight of propylene glycol monomethyl ether, about 1 to about 10% by weight of γ-butyrolactone, and about 1 to about 20% by weight of n-butyl acetate.

2. The method of claim 1, wherein removing a portion of the coating layer of the photosensitive composition from the substrate comprises:
applying the thinner composition to an edge portion of the substrate to selectively remove a portion of the coating layer of the photosensitive composition formed on the edge of the substrate.

3. The method of claim 2, wherein applying the thinner composition to the edge portion of the substrate comprises:
spraying the thinner composition to the edge portion of the substrate under a pressurized condition while rotating the substrate.

4. The method of claim 3, wherein the substrate rotates at a speed of about 300 to about 3,000 rpm, and the thinner composition is sprayed at a flow rate of about 5 to about 50 mL/min.

5. The method of claim 1, wherein removing a portion of the coating layer of the photosensitive composition from the substrate comprises:
applying the thinner composition to a backside of the substrate to selectively remove a portion of the coating layer attached to the backside of the substrate.

6. The method of claim 1, wherein the photosensitive composition is at least one selected from the group consisting of an I-line photoresist including a novolac-based resin, a KrF photoresist including poly(hydroxystyrene) partially protected by an acetal group or a tert-butyl carbonate group, an ArF photoresist including a (meth)acrylate-based resin, a KrF bottom anti-reflective coating including a triazine-based resin, and an ArF bottom anti-reflective coating including a polyester resin.

7. The method of claim 1, further comprising:
baking the coating layer of the photosensitive composition to form a photosensitive film on the substrate, after removing a portion of the coating layer of the photosensitive composition from the substrate by applying the thinner composition to the substrate.

8. The method of claim 7, further comprising:
detecting a defect existing on the photosensitive film; and
removing the photosensitive film having the defect from the substrate by applying the thinner composition to the photosensitive film.

9. The method of claim 1, wherein the thinner composition comprises:
about 55 to about 80% by weight of propylene glycol monomethyl ether acetate;
about 5 to about 20% by weight of propylene glycol monomethyl ether;
about 3 to about 8% by weight of γ-butyrolactone; and
about 5 to about 20% by weight of n-butyl acetate.

10. The method of claim 1, wherein the thinner composition comprises:
about 60 to about 80% by weight of propylene glycol monomethyl ether acetate;
about 5 to about 20% by weight of propylene glycol monomethyl ether;
about 3 to about 8% by weight of γ-butyrolactone; and
about 5 to about 20% by weight of n-butyl acetate.

11. The method of claim 1, wherein the thinner composition has a relative volatility in a range of about 0.2 to about 0.8, based on a volatility of n-butyl acetate.

12. The method of claim 1, further comprising a surfactant.

13. The method of claim 12, wherein the surfactant comprises a fluorine-based surfactant, a non-ionic surfactant or an ionic surfactant in an amount in a range of about 10 ppm to about 500 ppm, based on a total weight of the thinner composition.

* * * * *